(12) United States Patent
Sohn et al.

(10) Patent No.: US 7,368,949 B2
(45) Date of Patent: May 6, 2008

(54) OUTPUT DRIVER AND OUTPUT DRIVING METHOD FOR ENHANCING INITIAL OUTPUT DATA USING TIMING

(75) Inventors: Young-Soo Sohn, Gunpo-Si (KR); Jung-Hwan Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/561,765

(22) Filed: Nov. 20, 2006

(65) Prior Publication Data

US 2007/0115752 A1 May 24, 2007

(30) Foreign Application Priority Data

Nov. 18, 2005 (KR) .................. 10-2005-0110518

(51) Int. Cl.
*H03K 19/094* (2006.01)
*H03D 1/06* (2006.01)

(52) U.S. Cl. .................. 326/82; 326/86; 375/348

(58) Field of Classification Search .............. 326/26, 326/82, 86; 327/108, 379; 375/259, 346, 375/348, 340

See application file for complete search history.

(56) References Cited

U.S. PATENT DOCUMENTS

| | | | | |
|---|---|---|---|---|
| 6,064,356 A | * | 5/2000 | Shigeta | 345/63 |
| 6,185,716 B1 | * | 2/2001 | Riggle | 714/769 |
| 7,126,394 B2 | * | 10/2006 | Hargan | 327/170 |
| 7,277,499 B2 | * | 10/2007 | Wetzker | 375/316 |
| 2003/0099310 A1 | * | 5/2003 | Zvonar | 375/340 |

FOREIGN PATENT DOCUMENTS

| | | |
|---|---|---|
| JP | 2002-368600 | 12/2002 |
| JP | 2003-243940 | 9/2003 |
| KR | 2002-0083329 | 11/2002 |

OTHER PUBLICATIONS

English Abstract for Publication No.: 1020020083329, filing date: Apr. 27, 2001, pub date: Nov. 2, 2002.
English Abstract for Publication No.: JP2002368600, pub date: Dec. 20, 2002.
English Abstract for Publication No.: JP2003243940, pub date: Aug. 29, 2003.

* cited by examiner

*Primary Examiner*—Rexford Barnie
*Assistant Examiner*—Thienvu V Tran
(74) *Attorney, Agent, or Firm*—F. Chau & Associates, LLC (57) ABSTRACT

An output driver for enhancing initial output data using timing includes a selection signal generation unit for generating a selection signal, a reference data generation unit for generating reference data, and a selection unit. The selection signal is activated at the transition point of the input data, generated after being maintained in a same logic state during a number of bit periods that is equal to or greater than a predetermined duration number. The reference data is delayed from the input data by a delay time shorter than one bit period. The selection unit is driven to transition the logic state of the output data depending on the transition of the logic state of any one of the input data and the reference data in response to the selection signal.

14 Claims, 7 Drawing Sheets

- - - - - - : OUTPUT DATA IN PRESENT INVENTION

←- - - - -→ : OUTPUT DATA EYE WINDOW IN PRESENT INVENTION

———— : OUTPUT DATA OBTAINED WHEN INITIAL DATA ENHANCEMENT IS NOT PERFORMED

←————→ : OUTPUT DATA EYE WINDOW OBTAINED WHEN INITIAL DATA ENHANCEMENT IS NOT PERFORMED

FIG. 7

OUTPUT DRIVER AND OUTPUT DRIVING METHOD FOR ENHANCING INITIAL OUTPUT DATA USING TIMING

CROSS-REFERENCE TO RELATED APPLICATION

This application claims priority to Korean Patent Application No. 10-2005-110518, filed on Nov. 18, 2005, in the Korean Intellectual Property Office, the disclosure of which is herein incorporated by reference in its entirety.

BACKGROUND OF THE INVENTION

1. Field of the Invention

The present invention relates to a data output driver and output driving method, and more particularly to an output driver and output driving method, which compensate for the attenuation of transmission data during data communication.

2. Description of Related Art

Transmission data generated by a transmission device is transmitted to a reception device through a transmission line. The transmission device is typically provided with an output driver for outputting the transmission data. Transmission data is composed of a plurality of data bits to be consecutively transmitted. In the case of a data bit having a logic state differing from that of a previous data bit, there may occur a phenomenon where a rising or falling edge of the data bit is not sufficiently developed. The phenomenon, due to the previous data bit, may be referred to as Inter-Symbol Interference (hereinafter referred to as "ISI"). Due to ISI, attenuation of transmission data may occur. The ISI may further increase when the data bit having the logic state differing from that of the previous data bit is transmitted immediately after several data bits having the same logic state have been transmitted.

Various types of output drivers for compensating for the attenuation of transmission data caused by ISI have been developed.

Figure 1:
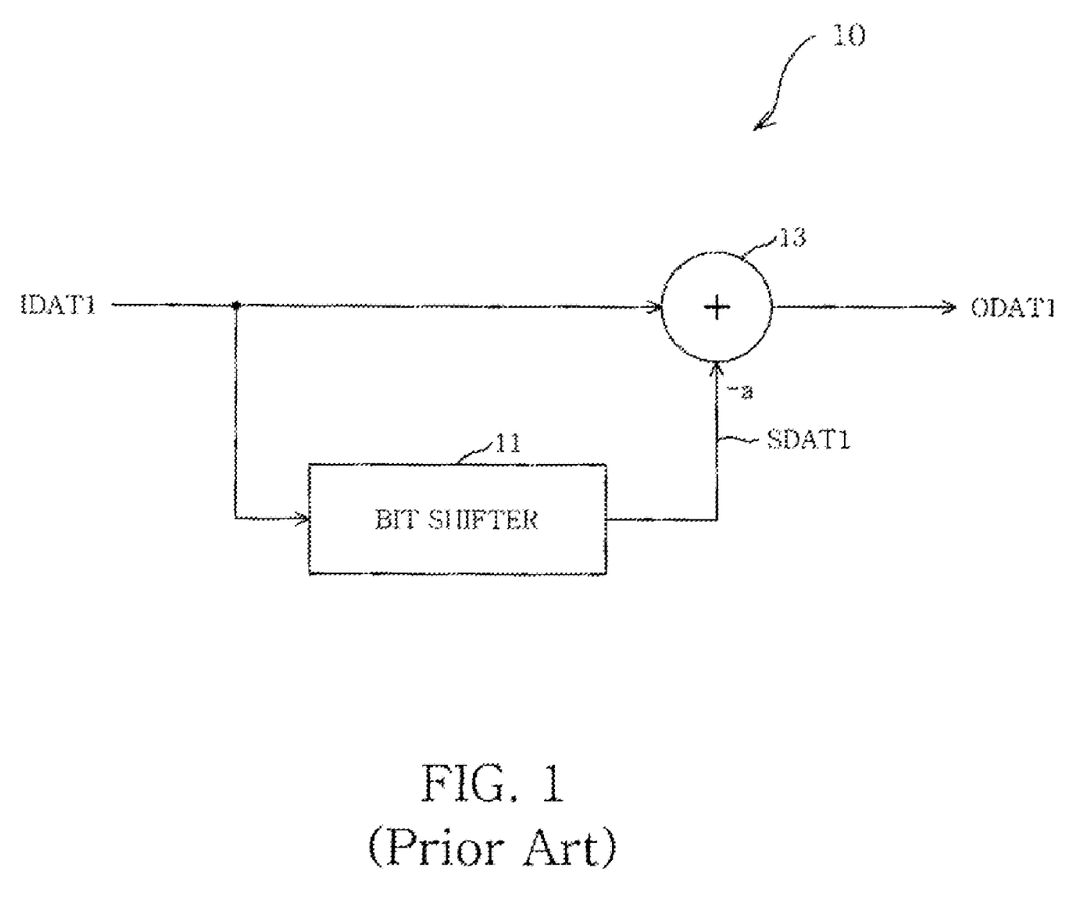
FIG. 1 is a diagram showing an example of a conventional output driver.
Figure 2:
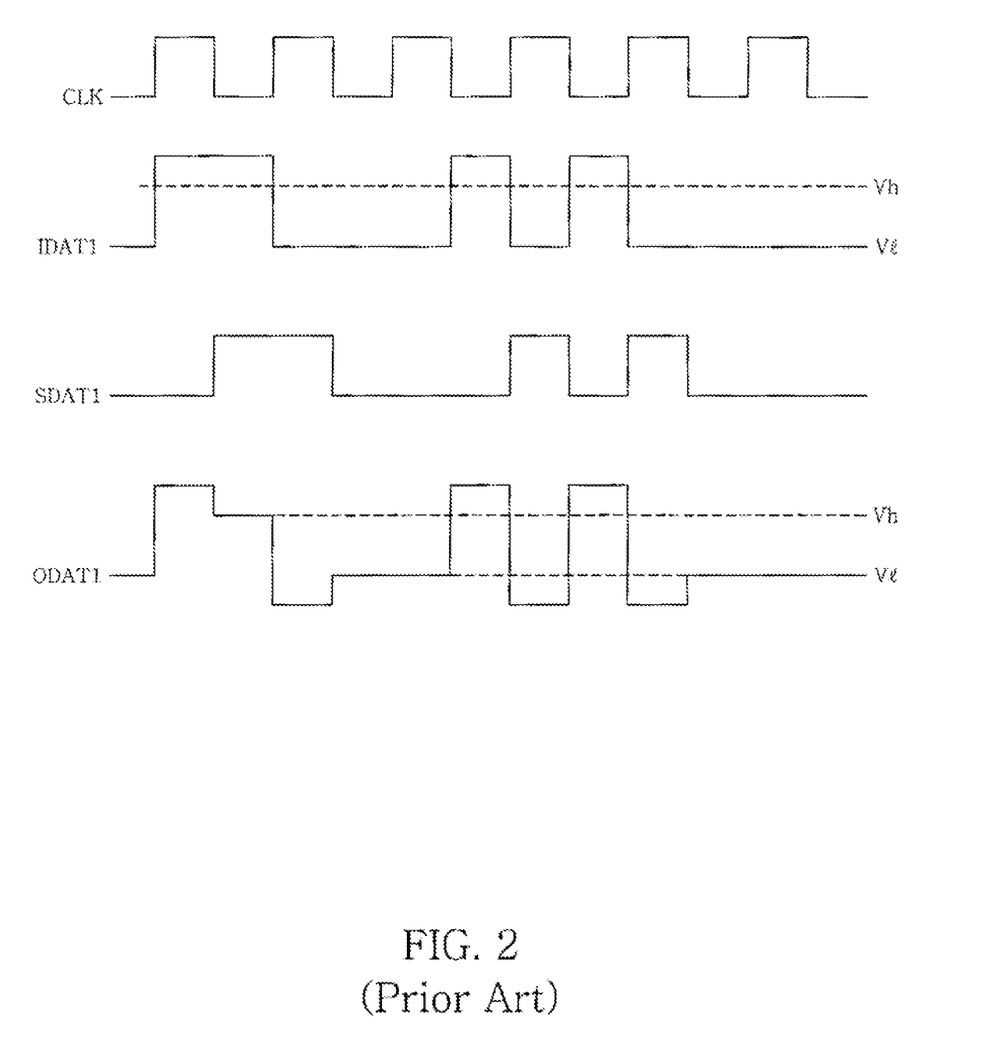
FIG. 2 is a timing diagram showing the principal signals of the output driver of FIG. 1.

FIG. 1 is a diagram showing an example of an output driver. FIG. 2 is a timing diagram showing the signals of the output driver of FIG. 1.

In an output driver 10 in FIG. 1, a bit shifter 11 shifts input data IDAT1 by one bit period and generates shifted data SDAT1. Further, a data adder 13 performs an operation of Equation [1] and generates output data ODAT1, $$V(ODAT1) - a*V(SDAT1) \qquad [1]$$

where V(ODAT1), V(IDAT1) AND V(SDAT1) denote the voltage levels of the output data ODAT1, the input data IDAT1 and the shifted data SDAT1, respectively. Further, "a" denotes a positive constant.

As shown in FIG. 2, in the output data ODAT1, the swing range of one bit value increases whenever the logic state of the output data ODAT1 is transitioned. Therefore, the attenuation of the output data ODAT1 is mitigated due to the increasing swing range.

Figure 3:
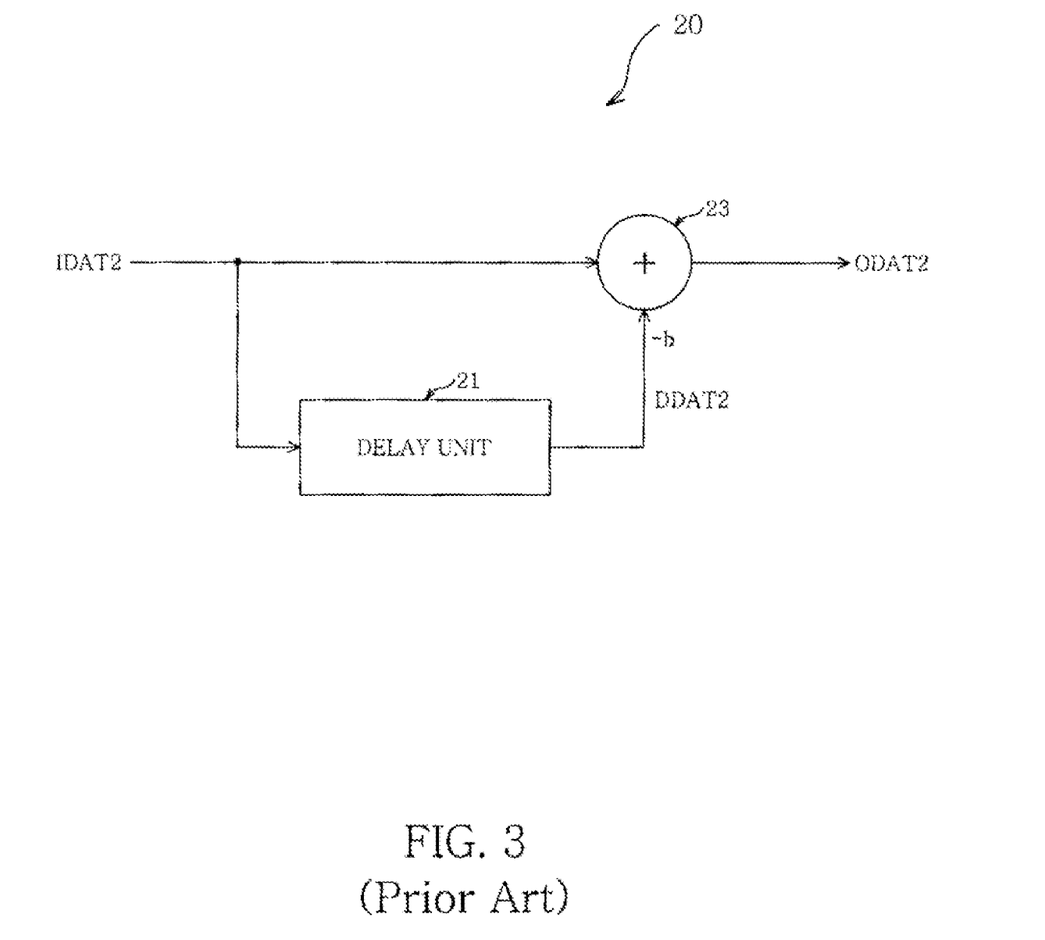
FIG. 3 is a diagram showing another example of a conventional output driver.
Figure 4:
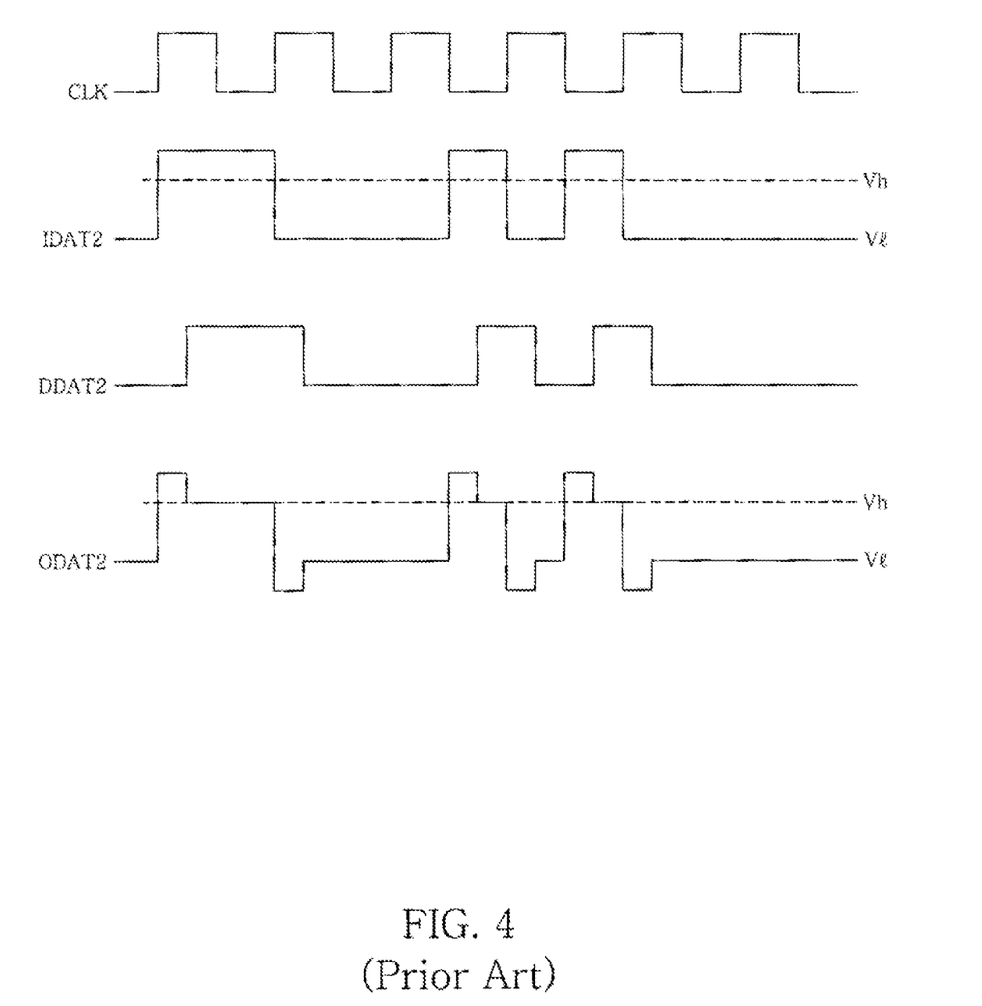
FIG. 4 is a timing diagram showing the principal signals of the output driver of FIG. 3.

FIG. 3 is a diagram showing another example of an output driver. FIG. 4 is a timing diagram showing the signals of the output driver of FIG. 3.

In the output driver 20 of FIG. 3, a delay unit 21 delays input data IDAT2 and generates delayed data DDAT2. Further, a data adder 23 performs an operation of Equation [2] and generates output data ODAT2, $$V(ODAT2) = V(IDAT2) - b*V(DDAT2) \qquad [2]$$

where V(ODAT2, V(IDAT2) and V(DDAT2) denote the voltage levels of the output data ODAT2, the input data IDAT2 and the delayed data DDAT2, respectively. Further, "b" denotes a positive constant.

As shown in FIG. 4, the initial voltage level of the output data ODAT2 is intensified whenever the logic state of the output data ODAT2 is transitioned. The attenuation of the output data ODAT2 is mitigated due to the intensified initial voltage level.

In the output drivers shown in FIGS. 1 and 3, the input data IDAT1 and IDAT2 and the output data ODAT1 and ODAT2 operate at a high voltage higher than a voltage level Vh in a logic H state, and at a low voltage lower than a voltage level V1 in a logic L state. The output drivers of FIGS. 1 and 3 need to include circuits for generating the high voltage and the low voltage.

Therefore, a need exists for an output driver and output driving method that compensate for the attenuation of transmission data during data communication without circuits for generating the high voltage and the low voltage.

SUMMARY OF THE INVENTION

In accordance with an embodiment of the present invention an output driver for generating output data comprises a selection signal generation unit for generating a selection signal based on input data having consecutively valid data bits during a plurality of consecutive bit periods, the selection signal being activated at a transition point of the input data, generated after being maintained in a same logic state during a number of bit periods that is equal to or greater than a predetermined duration number. The output driver comprises a reference data generation unit for delaying the input data by a delay time shorter than one bit period, and generating reference data, and a selection unit, electrically coupled to the selection signal generation unit and the reference data generation unit, driven to transition a logic state of the output data depending on a transition of a logic state of any one of the input data and the reference data in response to the selection signal.

In accordance with an embodiment of the present invention an output driving method of generating output data comprises generating a selection signal based on input data having a plurality of consecutive data bits, the selection signal being activated at a transition point of the input data, the transition point generated after the input data has been maintained in a same logic state during a number of bit periods that is equal to or greater than a predetermined duration number, generating reference data as the input data delayed by a delay time shorter than one bit period, and transitioning a logic state of the output data depending on a transition of a logic state of any one of the input data and the reference data in response to the selection signal.

BRIEF DESCRIPTION OF THE DRAWINGS

Embodiments of the present invention will be more clearly understood from the following detailed description taken in conjunction with the accompanying drawings, in which.

DETAILED DESCRIPTION OF PREFERRED EMBODIMENTS

Figure 5:
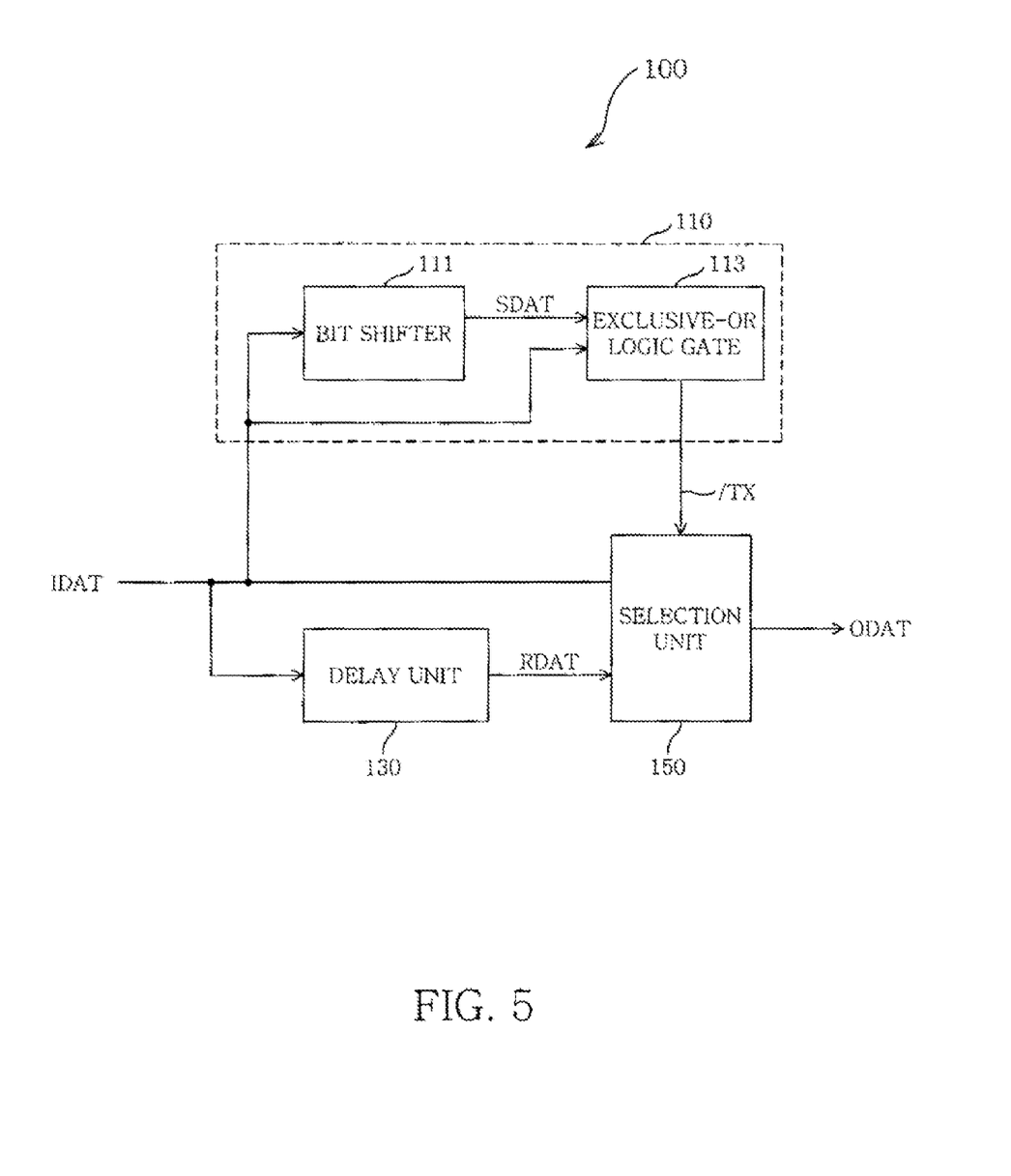
FIG. 5 is a diagram showing an output driver according to an embodiment of the present invention.
Figure 6:
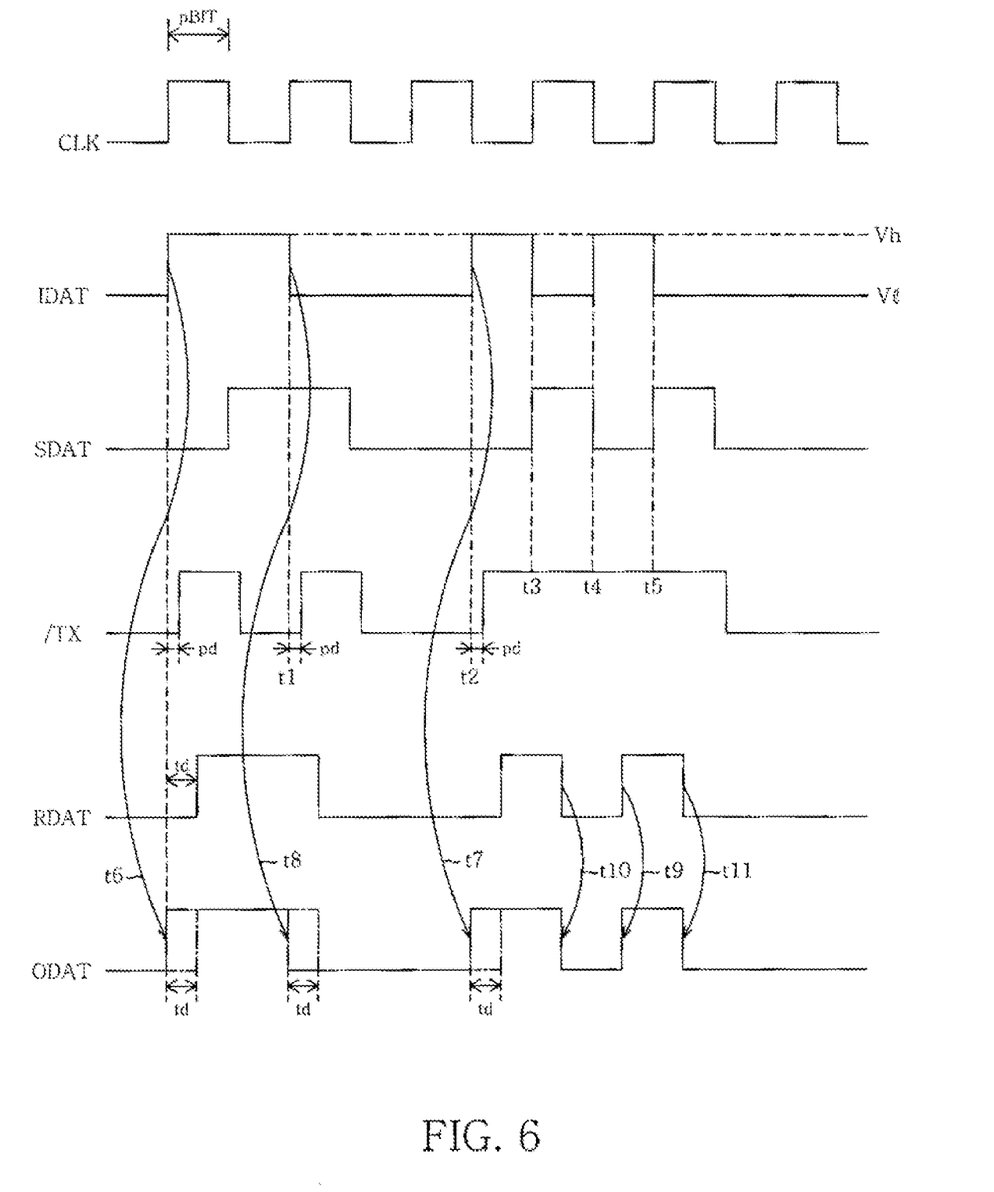
FIG. 6 is a timing diagram showing the principal signals of the output driver of FIG. 5.

FIG. 5 is a diagram showing an output driver 100 according to an embodiment of the present invention. FIG. 6 is a timing diagram showing signals of the output driver 100 of FIG. 5.

Reference character CLK denotes a clock signal used to indicate a bit period pBIT.

The output driver 100 drives output data ODAT corresponding to input data IDAT. In this case, the input data IDAT has consecutively valid data bits for a plurality of consecutive bit periods. According to an embodiment of the present invention, a single data bit is assigned to a single bit period pBIT.

Referring to FIG. 5, the output driver 100 includes a selection signal generation unit 110, a reference data generation unit 130 and a selection unit 150.

The selection signal generation unit 110 receives the input data IDAT, and generates a selection signal /TX based on the input data IDAT. The selection signal /TX is activated to a logic L state at the transition point of the input data IDAT, generated after being maintained in the same logic state for a number of bit periods that is equal to or greater than a predetermined duration number, e.g., 2.

In detail, the selection signal generation unit 110 includes a bit shifter 111 and a logic operation means 113.

The bit shifter 111 delays the received input data IDAT by one bit period pBIT. The shifted data SDAT output from the bit shifter 111 is shifted from the input data IDAT by one bit period, as shown in FIG. 6.

The logic operation means 113 performs a logic operation on the input data IDAT and the shifted data SDAT, thus generating the selection signal /TX. Preferably, the logic operation means 113 is an Exclusive-OR logic gate for performing an Exclusive-OR operation on the input data IDAT and the shifted data SDAT. In an interval during which the input data IDAT and the shifted data SDAT have the same logic state, the selection signal /TX is transitioned to a logic L state. Further, in an interval during which the input data IDAT and the shifted data SDAT have different logic states, the selection signal /TX is transitioned to a logic H state.

The transition of the logic state of the selection signal /TX occurs after being delayed from that of the input data IDAT or the shifted data SDA by a predetermined period (each "pd" in FIG. 6).

At the point at which the input data IDAT is transitioned after being maintained in the same logic state for two or more bit periods (refer to t1 and t2 in FIG. 6) the selection signal /TX is activated to a logic L state. At the point at which the input data IDAT is transitioned again after one bit period (refer to t3, t4 and t5 in FIG. 6) the selection signal /TX is deactivated to a logic H state.

Referring to FIG. 5, the reference data generation unit 130 delays the input data IDAT by a predetermined delay time (refer to td in FIG. 6), thus generating reference data RDAT. The delay time td is shorter than the bit period pBIT.

The selection unit 150 generates output data ODAT that is transitioned depending on the transition of the logic state of any one of the input data IDAT and the reference data RDAT in response to the selection signal /TX.

According to an embodiment of the present invention, when the selection signal /TX is in a logic L state, the transition of the logic state of the output data ODAT follows the transition of the input data IDAT. The logic state of the output data ODAT is also transitioned to a logic H state in response to the transition of the input data IDAT to a logic H state (refer to t6 and t7 in FIG. 6). Further, the logic state of the output data ODAT is also transitioned to a logic L state in response to the transition of the input data IDAT to a logic L state (refer to time t8 in FIG. 6).

When the selection signal /TX is in a logic H state, the transition of the logic state of the output data ODAT follows the transition of the reference data RDAT. The logic state of the output data ODAT is also transitioned to a logic H state in response to the transition of the reference data RDAT to a logic H state (refer to t9 in FIG. 6). The logic state of the output data ODAT is transitioned to a logic L state in response to the transition of the reference data RDAT to a logic L state (refer to t10 and t11 in FIG. 6).

If the input data IDAT is transitioned after being maintained in the same logic state for a number of bit periods that is equal to or greater than the duration number (e.g., '2' in the above example), the logic state of the output data ODAT is transitioned in response to the input data IDAT. As shown in FIG. 6, the logic state of the output data ODAT is transitioned earlier than the reference data RDAT by the delay time td. Accordingly, the attenuation of data that may occur in the output data ODAT can be mitigated.

If the logic state of the input data IDAT is transitioned at each bit period, the logic state of the output data ODAT is transitioned depending on the reference data RDAT; the output data ODAT is not transitioned in advance. Such an operation is performed in consideration of the fact that the attenuation of transmission data is relatively low when the logic state of the transmission data is transitioned at each bit. In this case, a period secured for data that is transitioned at each bit can be sufficiently assigned as one bit period.

Figure 7:
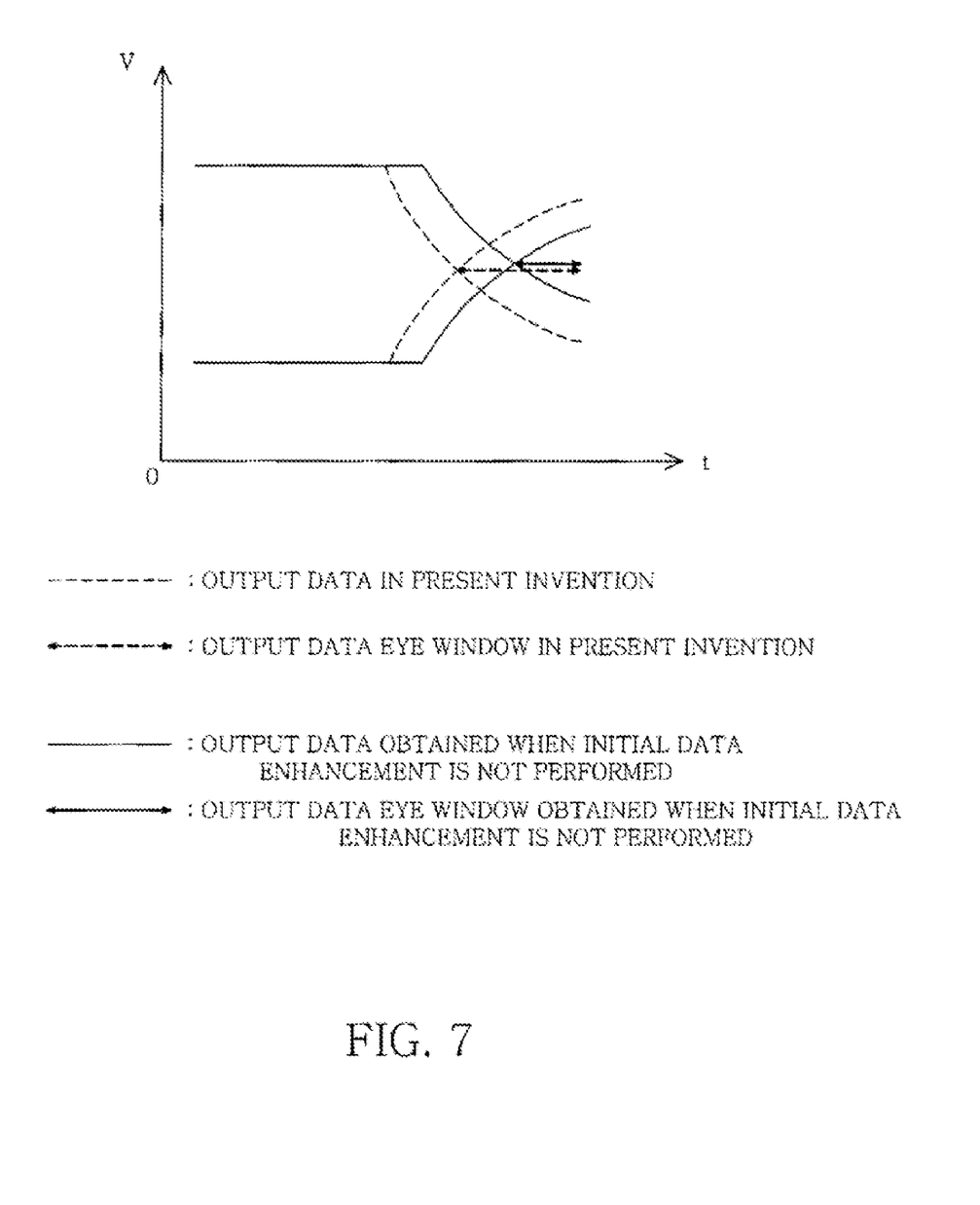
FIG. 7 is a graph showing the effect of the output driver according to an embodiment of the present invention.

FIG. 7 is a graph showing the effect of the output driver according to an embodiment of the present invention. As shown in FIG. 7, the logic state of the output data ODAT is transitioned in advance in response to the input data IDAT, not the reference data RDAT. The eye window of the output data ODAT increases compared to that of the case where the enhancement of initial data is not performed.

In the above-described output driver and output driving method according to an embodiment of the present invention, the input data IDAT and the output data ODAT are not needed to be driven to a voltage level higher than the voltage level Vh in a logic H state, nor a voltage level lower than the voltage level Vl in a logic L state, so as to enhance the initial input or output data. The output driver and output driving method according to an embodiment of the present invention cause the transition of the logic state of the output data ODAT in advance of the reference data RDAT, thus generating an effect similar to the enhancement of initial data. Therefore, the output driver does not require circuits for generating a high voltage higher than a typical high voltage level nor a low voltage lower than a typical low voltage level.

Further, in the output driver according to an embodiment of the present invention output data is generated by the selection unit. Therefore, the capacitance of the output stage of the output driver decreases compared to the conventional output drivers in FIGS. 1 and 3.

Although preferred embodiments of the present invention have been disclosed for illustrative purposes, those skilled in the art will appreciate that various modifications, additions and substitutions are possible, without departing from the scope and spirit of the disclosure.

For example, according to an embodiment of the present specification, the duration number is 2. The number of bit periods shifted by the bit shifter and/or the construction of a logic operation means are changeable, so that the duration number can be changed to, for example, 1, or a number equal to or greater than 3.

What is claimed is:

1. An output driver of generating output data, comprising:
    a selection signal generation unit for generating a selection signal based on input data having consecutively valid data bits during a plurality of consecutive bit periods, the selection signal being activated at a transition point of the input data, generated after being maintained in a same logic state during a number of bit periods that is equal to or greater than a predetermined duration number;
    a reference data generation unit for delaying the input data by a delay time shorter than one bit period, and generating reference data as delayed input data; and
    a selection unit, electrically coupled to the selection signal generation unit and the reference data generation unit, driven to transition a logic state of the output data depending on a transition of a logic state of any one of the input data and the reference data in response to the selection signal.

2. The output driver according to claim 1, wherein the selection unit is driven to transition the logic state of the output data depending on the transition of the logic state of the input data in response to a deactivated selection signal.

3. The output driver according to claim 1, wherein the selection unit is driven to transition the logic state of the output data depending on the transition of the logic state of the reference data in response to an activated selection signal.

4. The output driver according to claim 1, wherein the predetermined duration number is 2 bit periods.

5. The output driver according to claim 1, wherein the predetermined duration number is a multiple of one bit period.

6. The output driver according to claim 5, wherein the selection signal generation unit comprises:
    a bit shifter for shifting the input data by one bit period and generating shifted data; and
    logic operation means for performing a logic operation on the input data and the shifted data to generate the selection signal.

7. The output driver according to claim 6, wherein the logic operation means comprises an Exclusive-OR logic gate for performing an Exclusive-OR operation on the input data and the shifted data.

8. An output driving method of generating output data, comprising:
    generating a selection signal based on input data having a plurality of consecutive data bits, the selection signal being activated at a transition point of the input data, the transition point generated after the input data has been maintained in a same logic state during a number of bit periods that is equal to or greater than a predetermined duration number;
    generating reference data as the input data delayed by a delay time shorter than one bit period; and
    transitioning a logic state of the output data depending on a transition of a logic state of any one of the input data and the reference data in response to the selection signal.

9. The output driving method according to claim 8, wherein the transitioning of the logic state comprises performing driving to transition the logic state of the output data depending on the transition of the logic state of the input data in response to a deactivated selection signal.

10. The output driving method according to claim 8, wherein the transitioning of the logic state comprises performing driving to transition the logic state of the output data depending on the transition of the logic state of the reference data in response to an activated selection signal.

11. The output driving method according to claim 8, wherein the predetermined duration number is 2 bit periods.

12. The output driver method according to claim 8, wherein the predetermined duration number is a multiple of one bit period.

13. The output driving method according to claim 12, wherein the generating of the selection signal comprises:
    generating shifted data by shifting the input data by one bit period; and
    performing a logic operation on the input data and the shifted data to generate the selection signal.

14. The output driving method according to claim 13, wherein the performing of the logic operation is executed to perform an Exclusive-OR operation on the input data and the shifted data.

* * * * *